(12) United States Patent
Menard et al.

(10) Patent No.: US 8,704,270 B2
(45) Date of Patent: Apr. 22, 2014

(54) SHOCKLEY DIODE HAVING A LOW TURN-ON VOLTAGE

(75) Inventors: Samuel Menard, Tours (FR); Yannick Hague, Mettray (FR)

(73) Assignee: STMicroelectronics (Tours) SAS, Tours (FR)

( * ) Notice: Subject to any disclaimer, the term of this patent is extended or adjusted under 35 U.S.C. 154(b) by 36 days.

(21) Appl. No.: 13/210,830

(22) Filed: Aug. 16, 2011

(65) Prior Publication Data
US 2012/0061719 A1 Mar. 15, 2012

(30) Foreign Application Priority Data

Aug. 17, 2010 (FR) ...................................... 10 56633

(51) Int. Cl.
*H01L 29/66* (2006.01)
(52) U.S. Cl.
USPC .................................. 257/109; 257/E29.337
(58) Field of Classification Search
USPC ........................................... 257/109, E29.337
See application file for complete search history.

(56) References Cited

U.S. PATENT DOCUMENTS

| 4,109,274 A * | 8/1978 | Belenkov et al. ............. 257/110 |
| 5,710,443 A * | 1/1998 | Blanchard ..................... 257/110 |
| 3,236,698 A1 | 2/2006 | Shockley |
| 2003/0116779 A1 | 6/2003 | Ballon et al. |

FOREIGN PATENT DOCUMENTS

GB 1506478 A 4/1978

OTHER PUBLICATIONS

French Search Report dated Jan. 20, 2011 from corresponding French Application No. 10/56633.
Taylor, Paul D., Thyristor Design and Realization, Dec. 31, 1987, John wiley & Sons, USA, XP002617500, pp. 6-12, 151-153.

* cited by examiner

*Primary Examiner* — Benjamin Sandvik
*Assistant Examiner* — Leslie Pilar Cruz
(74) *Attorney, Agent, or Firm* — Wolf, Greenfield & Sacks, P.C.

(57) ABSTRACT

A Shockley diode including: a vertical stack of first to fourth layers of alternated conductivity types between first and second electrodes; a recess formed in the fourth layer and extending vertically to penetrate into the second layer; a first region of same conductivity type as the second layer but of greater doping level, extending at the bottom of the recess in the second layer; and a second region of same conductivity type as the third layer but of greater doping level, extending along the lateral walls of the recess and connecting the first region to the fourth layer.

20 Claims, 2 Drawing Sheets

SHOCKLEY DIODE HAVING A LOW TURN-ON VOLTAGE

CROSS REFERENCE TO RELATED APPLICATIONS

This application claims the priority benefit of French patent application number 10/56633, filed on Aug. 17, 2010, entitled SHOCKLEY DIODE HAVING A LOW TURN-ON VOLTAGE, which is hereby incorporated by reference to the maximum extent allowable by law.

BACKGROUND OF THE INVENTION

1. Field of the Invention

The present invention relates to protection structures of Shockley diode type. It more specifically aims at forming such structures with low turn-on voltages.

2. Discussion of the Related Art

FIG. 1 very schematically shows a bidirectional protection structure of double Shockley diode type, connected between terminals A1 and A2 of a circuit to be protected (not shown). This structure comprises two Shockley diodes 1 and 3 in antiparallel between terminals A1 and A2. Diode 1 is formed of a stack of four layers, respectively 1a to 1d, of alternating conductivity types. Layer 1a, of type P, is connected to terminal A1, and layer 1d, of type N, is connected to terminal A2. Diode 3 is formed of a stack of four layers, respectively 3a to 3d, of alternating conductivity types. Layer 3a, of type P, is connected to terminal A2, and layer 3d, of type N, is connected to terminal A1.

When a positive overvoltage occurs between terminals A1 and A2 and exceeds a threshold VBR, the NP blocking junction of diode 1, formed by regions 1a and 1c, becomes conductive by avalanche effect. Then, by thyristor effect, the voltage drop across diode 1 becomes much lower than the avalanche voltage. When a negative overvoltage occurs between terminals A1 and A2, the overvoltage is similarly removed via diode 3.

At the end of the overvoltage, when the current flowing through the Shockley drops below a threshold IH, the diode turns back off (thyristor opening).

Shockley diodes are generally used for protection involving high turn-on thresholds. Indeed, Shockley diodes with low turn-on thresholds, for example, VBR<25 V can be difficult and expensive to manufacture. Further, it is generally difficult to obtain both a low turn-on voltage VBR and an optimum turn-off threshold IH.

It would be desirable to be able to more easily manufacture Shockley diodes with low turn-on thresholds.

SUMMARY OF THE INVENTION

Thus, an embodiment provides a Shockley diode type protection structure overcoming at least some of the disadvantages of existing solutions.

An embodiment provides such a low turn-on voltage structure that can be made by conventional tried and tested methods, where the turn-on voltage can be accurately set.

An embodiment provides such a structure in which turn-off threshold IH and the turn-on threshold may be set independently.

Another embodiment provides a method for forming such a structure.

Thus, an embodiment provides a Shockley diode comprising: a vertical stack of first to fourth layers of alternated conductivity types between first and second electrodes; a recess formed in the fourth layer and extending vertically to penetrate into the second layer; a first region of same conductivity type as the second layer but of greater doping level, extending at the bottom of the recess in the second layer; and a second region of same conductivity type as the third layer but of greater doping level, extending along the lateral walls of the recess and connecting the first region to the fourth layer.

According to an embodiment, short-circuit holes of the same conductivity type as the third layer cross the fourth layer.

According to an embodiment, the recess is covered with an insulating passivation layer.

According to an embodiment, the first region is an N-type region with a doping level ranging between $5 \times 10^{20}$ and $5 \times 10^{21}$ atoms/cm$^3$, and the second region is a P-type region with a doping level ranging between $1 \times 10^{19}$ and $5 \times 10^{19}$ atoms/cm$^3$.

Another embodiment provides a bidirectional protection structure comprising first and second Shockley diodes of the above-described type, wherein: the first electrode of the first diode and the second electrode of the second diode are confounded; the first layer of the first diode and the third layer of the second diode are confounded; the second layer of the first diode and the second layer of the second diode are confounded; the third layer of the first diode and the first layer of the second diode are confounded; and the second electrode of the first diode and the first electrode of the second diode are confounded.

Another embodiment provides a method for manufacturing a protection diode, comprising the steps of: a) forming a recess in the fourth layer of a vertical stack of first to fourth layers of alternated conductivity types, this recess extending vertically to penetrate into the second layer; b) forming a first region of same conductivity type as the second layer but of greater doping level, extending at the bottom of the recess in the second layer; and c) forming a second region of same conductivity type as the third layer but of greater doping level, extending along the lateral walls of the recess and connecting the first region to the fourth layer.

According to an embodiment, at step a), the recess is formed at the same time as a to peripheral trench surrounding the diode.

According to an embodiment, at step c), the second region is formed with no masking by implantation of dopant elements over the entire surface of the diode.

According to an embodiment, the method further comprises a step of deposition of an insulating passivation layer at the surface of the recess.

According to an embodiment, the method further comprises a step of forming of electrodes on the upper and lower surface side of the vertical stack.

BRIEF DESCRIPTION OF THE DRAWINGS

The foregoing will be discussed in detail in the following non-limiting description of specific embodiments in connection with the accompanying drawings.

DETAILED DESCRIPTION

Figure 1:
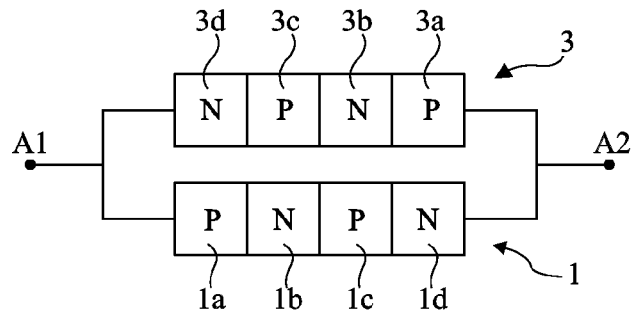
FIG. 1, previously described, very schematically shows a bidirectional protection structure of double Shockley diode type.

For clarity, the same elements have been designated with the same reference numerals in the different drawings and, further, as usual in the representation of integrated circuits, the various drawings are not to scale.

Figure 2A:
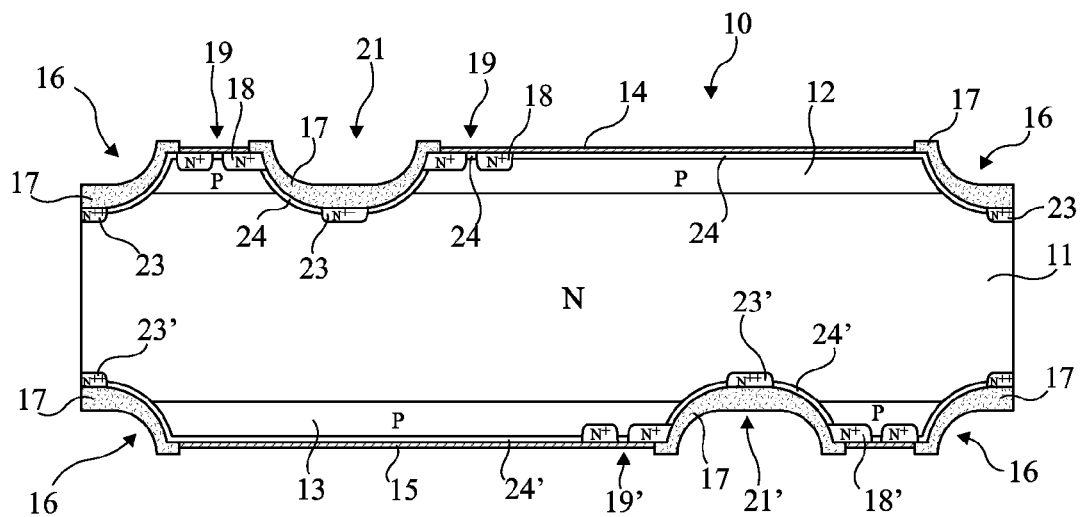
FIG. 2A is a cross-section view schematically showing an embodiment of a bidirectional protection structure of low turn-on voltage double Shockley diode type.
Figure 2B:
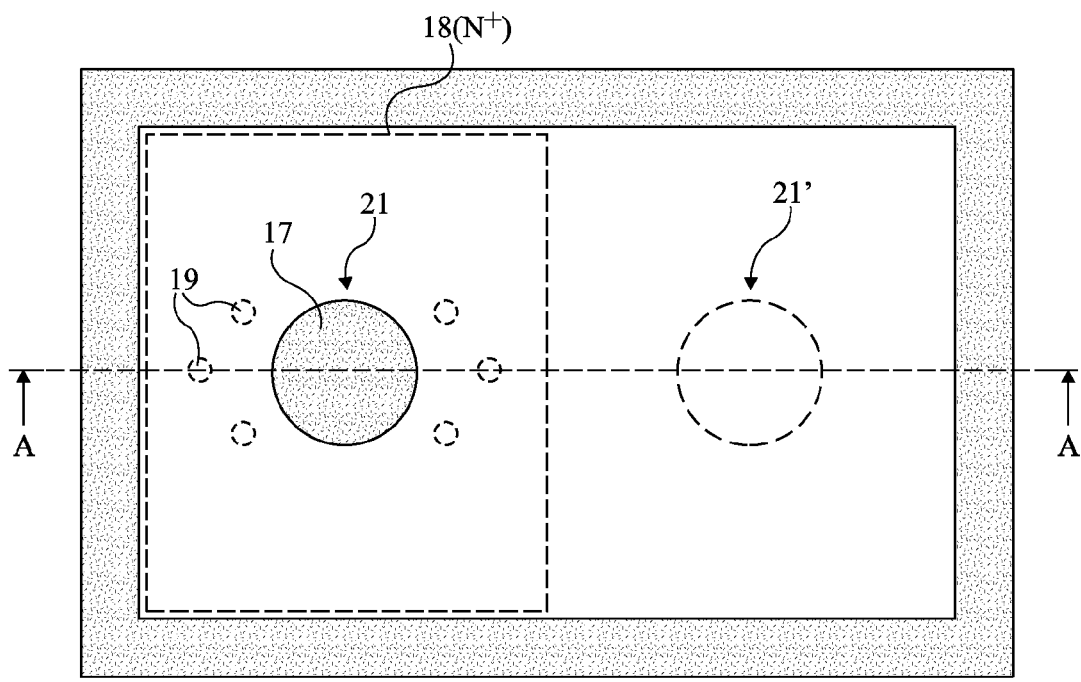
FIG. 2B is a top view schematically and partially showing the protection structure of FIG. 2A.

FIGS. 2A and 2B schematically show an embodiment of a bidirectional protection chip 10 of low turn-on voltage double Shockley diode type. FIG. 2B is a top view and FIG. 2A is a cross-section view along axis A-A of FIG. 2B.

Chip 10 is formed inside and on top of a semiconductor substrate 11 of a first conductivity type which will here be chosen to be type N. Layers 12 and 13, P-type doped, respectively extend on the upper surface side and on the lower surface side of the substrate, across the entire surface of the substrate, thus forming a vertical PNP stack.

An $N^+$-type region 18, of greater doping level than the substrate, is formed in the upper portion of layer 12. In this example, region 18 extends, in top view, approximately across one half of the chip surface (the left half in the shown example).

For example, in the shown example, short-circuit holes 19, formed of local P-type islands, cross region 18, thus connecting the upper surface of layer 18 to layer 12. Holes 19 are positioned to desensitize the structure (to increase threshold IH) while ensuring a good triggering in case of an overvoltage.

Electrodes 14 and 15, for example, made of metal, respectively cover the upper surface and the lower surface of chip 10.

To ensure the chip insulation, a curved trench 16 is formed at the periphery of the upper surface of the chip, crossing the PN junction formed by layer 12 and substrate 11. An insulating passivation layer 17 fills trench 16. A symmetrical trench is formed at the periphery of the lower surface of the chip, crossing the PN junction formed by layer 13 and substrate 11. Such a structure with peripheral trenches is generally called a mesa structure.

Layers 13, 11, 12, and region 18 form a vertical PNPN stack defining a Shockley diode in the left half of the chip, between electrodes 15 and 14.

A recess 21 formed in upper electrode 14 extends vertically through region 18 and layer 12, and penetrates into substrate 11. In this example, recess 21 has the shape of an outward-facing dish. In top view, recess 21 is approximately at the center of region 18 (at the center of the Shockley diode). More generally, recess 21 is located in a non-peripheral region of the Shockley diode and does not communicate with peripheral trench 16 of the mesa structure. Like peripheral trench 16, recess 21 is covered with an insulating passivation layer 17, for example, made of glass.

At the bottom of recess 21, and substantially at its center, an $N^{++}$-type region 23, having as high a doping level as possible, extends in substrate 11. The upper surface of region 23 follows the shape of the bottom of recess 21. Although, in the shown example, the bottom of the recess is flat, a recess with a curved bottom may also be provided. It should be noted that in the shown example (FIG. 2A), an $N^{++}$-type region 23 also extends at the bottom of peripheral trench 16. This peripheral region may, however, be omitted.

Further, along the lateral walls of recess 21, a thin $P^+$-type layer 24 of greater doping level than layer 12 extends. Layer 24 connects $N^{++}$-type region 23 to $N^+$-type region 18. In the shown example, layer 24 also extends along the lateral walls of peripheral trench 16, and at to the surface of P-type layer 12.

In case of a positive overvoltage between electrodes 15 and 14, due to the high doping level of regions 23 and 24, the breakdown region is located at the level of the auxiliary NP junction formed between regions 23 and 24, that is, under recess 21. A current then flows between electrodes 15 and 14, resulting in the triggering of the protection by thyristor effect. The overvoltage is then removed through the entire surface of the Shockley diode.

Thus, voltage VBR at which the protection is triggered is determined by the breakdown voltage of the auxiliary junction formed between regions 23 and 24. To obtain a lower threshold VBR, high doping levels will be selected for $P^+$ layer 24 and $N^{++}$ layer 23.

It should be noted that the curving of the bottom of recess 21 and the shape of region 23 may be another parameter for setting threshold VBR.

According to an advantage of the provided structure, regions 23 and 24, defining turn-on voltage VBR, are not located in the main overvoltage current drain-off path (regions 13, 11, 12, and 18). As a result, the presence of such heavily-doped local regions has no influence upon threshold IH for turning off the protection at the end of the overvoltage. Such a decoupling of the parameters for setting turn-on threshold VBR and turn-off threshold IH allows for optimization of the protection.

In the example shown in FIGS. 2A and 2B, a second symmetrical Shockley diode is provided in the right-hand portion of chip 10, so that the entire structure forms a bidirectional protection of the type described in relation with FIG. 1.

An $N^+$-type region 18' of greater doping level than the substrate is formed in the lower portion of layer 13. In bottom view, region 18' extends approximately over the right half of the chip surface. In this example, short-circuit holes 19' cross region 18', thus connecting lower electrode 15 to layer 13.

A recess 21' formed in lower electrode 15 extends vertically through region 18' and layer 13, and penetrates into substrate 11. In bottom view, recess 21' is approximately located at the center of region 18'. More generally, recess 21' is located in a non-peripheral region of the Shockley diode and does not communicate with peripheral trench 16 of the mesa structure. Recess 21 is covered with an insulating passivation layer 17.

At the bottom of recess 21', an $N^{++}$-type region 23' of greater doping level than region 18' extends in substrate 11. Region 23' follows the shape of the bottom of recess 21'.

Further, along the lateral walls of recess 21', a thin $P^+$-type layer 24' of greater doping to level than layer 13 extends. Layer 24' connects $N^{++}$-type region 23' to $N^+$-type region 18'.

In an embodiment: chip 10 has, in top view, a square shape with a side length of approximately 2 millimeters, each Shockley diode taking up a rectangular surface area of 1×2 mm; P-type layers 12 and 13 have a thickness on the order of from 35 to 40 μm and a doping level on the order of from $10^{16}$ to $10^{17}$ atoms/cm$^3$; the doping level of $N^+$-type region 18 ranges between $5\times10^{19}$ and $1\times10^{20}$ atoms/cm$^3$; the doping level of $P^+$-type layer 24 ranges between $1\times10^{19}$ and $5\times10^{19}$ atoms/cm$^3$; the doping level of $N^{++}$-region 23 ranges between $5\times10^{20}$ and $5\times10^{21}$ atoms/cm$^3$; recess 21 has a depth of approximately 70 μm and, in top view, a circular contour with a diameter on the order of 300 μm; and region 23 takes up, in top view, a circular surface area with a diameter of approximately 100 μm. The present invention is however not limited to these specific values.

In the above-described example, each Shockley diode comprises a recess (respectively 21 and 21') in its central portion, and an auxiliary triggering $N^{++}/P^+$ junction associated with this recess. In an alternative embodiment, each Shockley diode may comprise several triggering recesses of the above-described type.

FIGS. 3A to 3D are cross-section views schematically illustrating steps of an example of a method for forming a protection structure of the type described in relation with FIGS. 2A and 2B. For simplification, not all the structure elements have been shown.

Figure 3A:
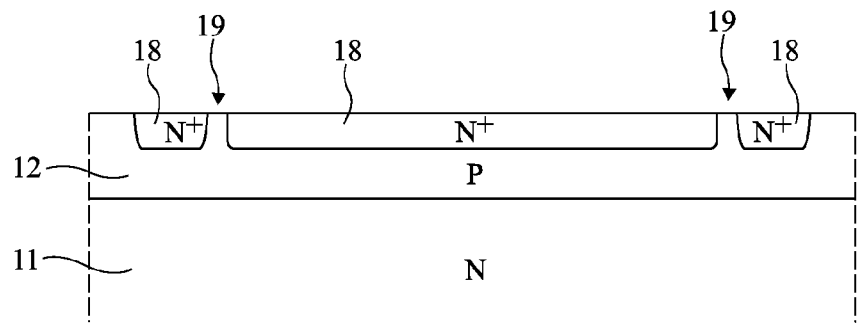
FIGS. 3A to 3D are simplified partial cross-section views illustrating steps of an example of a method for forming a protection structure of low turn-on voltage Shockley diode type.

FIG. 3A illustrates a first step in which a P-type doped layer 12 is formed at the surface of an N-type doped semiconductor substrate 11.

In the upper surface of layer 12, an $N^+$-type region 18 of greater doping level than substrate 11, extending, in top view, over a portion of the chip surface, is formed. In this example, region 18 is crossed by P-type short-circuit holes 19.

Figure 3B:
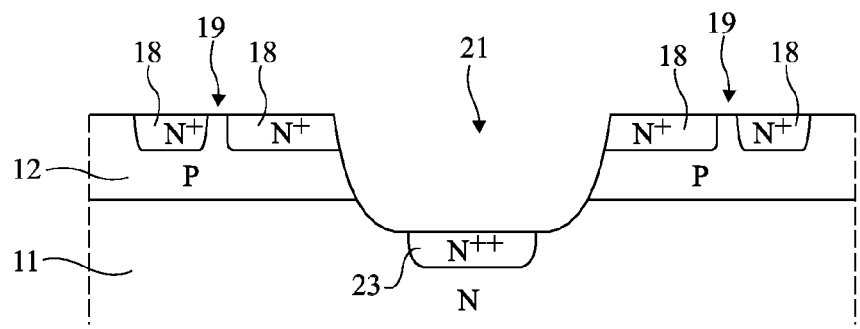

FIG. 3B illustrates the forming of a recess 21 in the central portion of region 18. Recess 21 extends through region 18 and layer 12, and penetrates into substrate 11. It should be noted that the present description is placed in the context of a mesa type structure manufacturing technology, that is, comprising a step of forming of a curved trench at the chip periphery. Recess 21 is formed at the same time as the mesa trench. Thus, the forming of recess 21 only requires a modification of the mask for etching the mesa, and requires no additional manufacturing step with respect to a conventional mesa structure.

At the bottom of recess 21, an $N^{++}$-type region 23 of greater doping level than region 18, extending in substrate 11, is formed. The forming of region 23 for example comprises a masking step followed by a step of implantation of dopant elements.

Figure 3C:
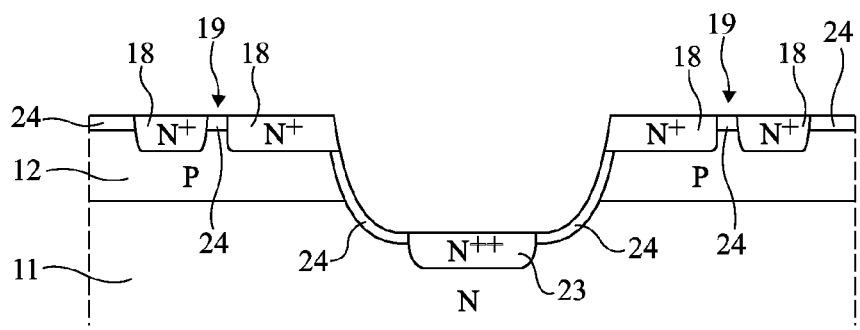

FIG. 3C illustrates a step of forming of a thin $P^+$-type layer 24 of greater doping level than layer 12, extending along the lateral walls of recess 21 and connecting region 23 to region 18. In this example, layer 24 is formed by diffusion of dopant elements over the entire surface of the substrate, and thus does not require the use of a mask. As a result, layer 24 also extends at the surface of layer 12, and along the lateral walls of the peripheral trench of the mesa (not visible in the drawing). It should be noted that the doping levels are such that the implantation of P-type dopant elements in $N^+$-type region 18 and $N^{++}$-type region 23 does not significantly modify the doping level of these regions.

Figure 3D:
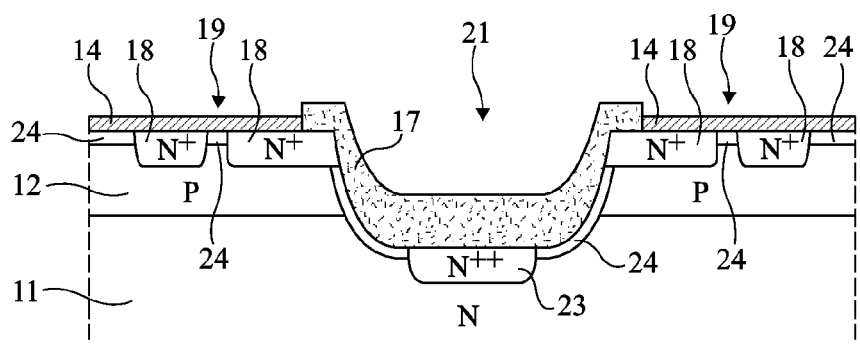

FIG. 3D illustrates a step of forming of a passivation layer 17, for example, made of glass, at the surface of recess 21. The deposition of passivation layer 17 is, for example, performed at the same time as the deposition of the peripheral passivation layer of the mesa, and thus requires no additional manufacturing step with respect to a conventional mesa structure.

An electrode 14, for example, a metal electrode is formed at the chip surface.

Although a portion only of protection structure 10 of FIGS. 2A and 2B has been shown in FIGS. 3A to 3D, the portions which have not been shown may be obtained by the same steps or by similar steps.

Thus, the provided structure is a particularly simple embodiment of a protection of Shockley diode type with a low turn-on voltage VBR. In particular, the forming of the auxiliary junction providing a low threshold VBR only requires a single additional masking step with respect to a conventional mesa structure (to form $N^{++}$-type region 23).

Specific embodiments of the present invention have been described. Various alterations, modifications and improvements will readily occur to those skilled in the art.

In particular, a bidirectional protection structure of double Shockley diode type has been shown and described in relation with FIGS. 2A and 2B. It will be within the abilities of those skilled in the art to adapt the provided structure to a one-way protection of simple Shockley diode type.

It will further be within the abilities of those skilled in the art to adapt the provided structure by inverting all conductivity types.

Having thus described at least one illustrative embodiment of the invention, various alterations, modifications, and improvements will readily occur to those skilled in the art. Such alterations, modifications, and improvements are intended to be within the spirit and to scope of the invention. Accordingly, the foregoing description is by way of example only and is not intended as limiting. The invention is limited only as defined in the following claims and the equivalents thereto.

What is claimed is:

1. A Shockley diode comprising:
   a vertical stack of first to fourth layers of alternated conductivity types between first and second electrodes;
   a recess formed in the fourth layer and extending vertically to penetrate into the second layer;
   a first region of a same conductivity type as the second layer but of greater doping level, extending from the bottom of the recess in the second layer; and
   a second region of a same conductivity type as the third layer, of lower doping level than the first region but of greater doping level than the third layer, extending from the lateral walls of the recess and connecting the first region to the fourth layer.

2. The Shockley diode of claim 1, wherein short-circuit holes of same conductivity type as the third layer cross the fourth layer.

3. The Shockley diode of claim 1, wherein the recess is covered with an insulating passivation layer.

4. The Shockley diode of claim 1, wherein the first region is an N-type region with a doping level ranging between $5\times10^{20}$ and $5\times10^{21}$ atoms/cm$^3$, and the second region is a P-type region with a doping level ranging between $1\times10^{19}$ and $5\times10^{19}$ atoms/cm$^3$.

5. A bidirectional protection structure comprising first and second Shockley diodes of claim 1, wherein:
   the first electrode of the first diode and the second electrode of the second diode are confounded;
   the first layer of the first diode and the third layer of the second diode are confounded;
   the second layer of the first diode and the second layer of the second diode are confounded;
   the third layer of the first diode and the first layer of the second diode are confounded; and
   the second electrode of the first diode and the first electrode of the second diode are confounded.

6. A Shockley diode comprising:
   a first semiconductor region of a first conductivity type;
   a second semiconductor region of a second conductivity type adjacent to the first semiconductor region;
   a recess extending through the first semiconductor region;
   a third semiconductor region of the first type formed at a bottom of the recess; and
   a breakdown junction formed along a wall of the recess, wherein the breakdown junction comprises a forth semiconductor region of the second conductivity type connecting the first semiconductor region to the third semiconductor region and having a dopant concentration greater than that of the second semiconductor region.

7. The Shockley diode of claim 6, wherein the third semiconductor region has a higher dopant concentration than the first semiconductor region.

8. The Shockley diode of claim 6, wherein the dopant concentration of the third semiconductor region ranges between $5\times10^0$ and $5\times10^{21}$ atoms/cm$^3$.

9. The Shockley diode of claim 6, further comprising:
 a fifth semiconductor region of the first conductivity type adjacent the second semiconductor region; and
 a sixth semiconductor region of the second conductivity type adjacent the fifth semiconductor region, wherein the third semiconductor region extends into the fifth semiconductor region.

10. The Shockley diode of claim 9, wherein the first semiconductor region and third semiconductor region are formed by ion implantation.

11. The Shockley diode of claim 9, wherein the first, second, fifth, and sixth semiconductor regions are formed as a first vertical stack on a substrate.

12. The Shockley diode of claim 11, further comprising:
 a first metal electrode deposited adjacent at least a portion of a surface of the first semiconductor region; and
 a second metal electrode deposited adjacent at least a portion of a surface of the sixth semiconductor region.

13. The Shockley diode of claim 12, further comprising plural holes formed through the first semiconductor region at plural locations around the recess, wherein the holes provide short circuits between the first metal electrode and second semiconductor region.

14. The Shockley diode of claim 13, further comprising:
 a first thin semiconductor film of the second conductivity type located between the first metal electrode and second semiconductor region in the plural holes; and
 a second thin semiconductor film of the second conductivity type located between the second metal electrode and sixth semiconductor region.

15. The Shockley diode of claim 12, further comprising a passivation layer formed over the recess.

16. The Shockley diode of claim 12, further comprising:
 a peripheral recess formed around a periphery of the substrate;
 a seventh semiconductor region of the first conductivity type formed at a bottom of the peripheral recess; and
 a passivation layer formed over the peripheral recess.

17. The Shockley diode of claim 12 arranged as a forward Shockley diode, further comprising:
 a reverse Shockley diode as claimed in claim 12 formed in a reverse direction in the same substrate, wherein the forward Shockley diode and reverse Shockley diode form a bidirectional protection device.

18. The bidirectional protection device of claim 17, wherein the forward Shockley diode and the reverse Shockley diode are arranged side-by-side.

19. The bidirectional protection device of claim 17, wherein the second, fifth, and sixth semiconductor regions extend across the forward Shockley diode and the reverse Shockley diode.

20. The bidirectional protection device of claim 17, wherein the first and second metal electrodes extend across the forward Shockley diode and the reverse Shockley diode and form contacts on first and second faces of the bidirectional Shockley diode.

* * * * *

UNITED STATES PATENT AND TRADEMARK OFFICE
CERTIFICATE OF CORRECTION

PATENT NO.        : 8,704,270 B2
APPLICATION NO.   : 13/210830
DATED             : April 22, 2014
INVENTOR(S)       : Samuel Menard et al.

Page 1 of 1

It is certified that error appears in the above-identified patent and that said Letters Patent is hereby corrected as shown below:

**In the Specification:

At column, 2, line 43, after the word "a", please delete the word "to";

At column, 4, line 3, after the word "at", please delete the word "to";

At column, 4, line 54, after the word "doping", please delete the word "to";

At column, 5, line 35, after the word "a", please delete the word "to"; and

At column, 6, line 16, after the word "and", please delete the word "to".**

Signed and Sealed this
Eighth Day of July, 2014

Michelle K. Lee
*Deputy Director of the United States Patent and Trademark Office*